United States Patent
Seo et al.

(10) Patent No.: US 9,911,763 B2
(45) Date of Patent: Mar. 6, 2018

(54) THIN FILM TRANSISTOR ARRAY SUBSTRATE AND DISPLAY APPARATUS INCLUDING THE SAME

(71) Applicant: Samsung Display Co., Ltd., Yongin, Gyeonggi-Do (KR)

(72) Inventors: Ilhun Seo, Yongin (KR); Yongduck Son, Yongin (KR); Jaebeom Choi, Yongin (KR); Byoungki Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 99 days.

(21) Appl. No.: 14/872,610

(22) Filed: Oct. 1, 2015

(65) Prior Publication Data
US 2016/0300864 A1 Oct. 13, 2016

(30) Foreign Application Priority Data

Apr. 9, 2015 (KR) .................. 10-2015-0050240

(51) Int. Cl.
*H01L 27/12* (2006.01)
*H01L 27/32* (2006.01)
(Continued)

(52) U.S. Cl.
CPC ...... *H01L 27/1255* (2013.01); *H01L 27/0629* (2013.01); *H01L 27/124* (2013.01);
(Continued)

(58) Field of Classification Search
CPC .............. H01L 27/124; H01L 27/1255; H01L 27/1214; H01L 27/3265; H01L 27/0629;
(Continued)

(56) References Cited

U.S. PATENT DOCUMENTS

2006/0125390 A1 6/2006 Oh
2006/0131581 A1* 6/2006 Kim .................... H01L 27/1288
257/59
(Continued)

FOREIGN PATENT DOCUMENTS

KR 10-2006-0067049 A 6/2006
KR 10-2008-0008597 A 1/2008
(Continued)

OTHER PUBLICATIONS

Content Technologies, "Just the Facts 101 for Analysis and Design of Analog Integrated Circuits" 2017.*

*Primary Examiner* — Joseph C Nicely
(74) *Attorney, Agent, or Firm* — H.C. Park & Associates, PLC

(57) ABSTRACT

A thin film transistor array substrate comprises: a substrate; a driving thin film transistor including an active layer, a gate electrode, a source electrode, and a drain electrode; a first capacitor including a first electrode connected to the gate electrode, and a second electrode disposed at a layer different from a layer at which the first electrode is disposed and at least partially overlapping the first electrode; a first conductive layer disposed at a layer that is the same as the layer of the second electrode of the first capacitor; a second conductive layer disposed at a layer different from the layer at which the first conductive layer is disposed; and a bridge electrode disposed at a layer that is different from the first and second conductive layers, and contacting the first and second conductive layers so that the first and second conductive layers are electrically connected to each other.

19 Claims, 5 Drawing Sheets

(51) Int. Cl.
*H01L 51/52* (2006.01)
*H01L 27/06* (2006.01)

(52) U.S. Cl.
CPC ...... *H01L 27/1214* (2013.01); *H01L 27/1222* (2013.01); *H01L 27/326* (2013.01); *H01L 27/3262* (2013.01); *H01L 27/3265* (2013.01); *H01L 51/52* (2013.01); *H01L 51/5203* (2013.01)

(58) Field of Classification Search
CPC ... H01L 27/3262; H01L 27/326; H01L 51/52; H01L 51/5203
See application file for complete search history.

(56) References Cited

U.S. PATENT DOCUMENTS

| | | | |
|---|---|---|---|
| 2007/0075322 A1* | 4/2007 | Nakamura | H01L 27/12 257/97 |
| 2008/0017851 A1 | 1/2008 | Choi et al. | |
| 2008/0169461 A1 | 7/2008 | Park | |
| 2011/0124153 A1* | 5/2011 | Hosoba | H01L 21/02554 438/104 |
| 2011/0220898 A1* | 9/2011 | Yoon | H01L 27/1214 257/59 |
| 2011/0285610 A1* | 11/2011 | Yan | G09G 3/20 345/55 |
| 2012/0062813 A1* | 3/2012 | Koyama | G02F 1/136213 349/43 |
| 2012/0286263 A1* | 11/2012 | Miyake | H01L 27/1225 257/43 |
| 2013/0200379 A1* | 8/2013 | You | H01L 29/4908 257/59 |
| 2013/0328853 A1 | 12/2013 | Hong | |
| 2014/0097419 A1 | 4/2014 | Kim et al. | |
| 2014/0118232 A1* | 5/2014 | Kim | H01L 27/124 345/82 |
| 2015/0002796 A1* | 1/2015 | Fukunaga | G02F 1/133514 349/106 |
| 2015/0102349 A1* | 4/2015 | Lee | H01L 27/1255 257/71 |
| 2015/0144904 A1* | 5/2015 | Jeong | H01L 27/326 257/40 |
| 2016/0012775 A1* | 1/2016 | Jeong | H01L 27/3276 345/690 |
| 2016/0276376 A1* | 9/2016 | Sun | H01L 27/124 |
| 2017/0018652 A1* | 1/2017 | Liu | H01L 27/02 |

FOREIGN PATENT DOCUMENTS

| | | |
|---|---|---|
| KR | 10-2013-0139059 A | 12/2013 |
| KR | 10-2014-0044102 A | 4/2014 |

* cited by examiner

THIN FILM TRANSISTOR ARRAY SUBSTRATE AND DISPLAY APPARATUS INCLUDING THE SAME

CLAIM OF PRIORITY

This application makes reference to, incorporates into this specification the entire contents of, and claims all benefits accruing under 35 U.S.C. § 119 from an application earlier filed in the Korean Intellectual Property Office on Apr. 9, 2015 and there duly assigned Serial No. 10-2015-0050240.

BACKGROUND OF THE INVENTION

Field of the Invention

The present invention relates to a thin film transistor array substrate and a display apparatus including the thin film transistor array substrate.

Description of the Related Art

A display apparatus is an apparatus for displaying images, and an organic light-emitting diode (OLED) display apparatus or a liquid crystal display (LCD) apparatus are being widely used.

A substrate, on which a thin film transistor and wires for transferring signals are mounted, is used to drive a display apparatus such as an OLED display apparatus or an LCD apparatus.

SUMMARY OF THE INVENTION

One or more exemplary embodiments of the present invention include a thin film transistor array substrate and a display apparatus including the thin film transistor array substrate.

Additional aspects will be set forth in part in the description which follows and, in part, will be apparent from the description, or may be learned by practice of the presented embodiments.

According to one or more exemplary embodiments of the present invention, a thin film transistor array substrate includes: a substrate; a driving thin film transistor disposed on the substrate, the driving thin film transistor including an active layer, a gate electrode, a source electrode, and a drain electrode; a first capacitor including a first electrode connected to the gate electrode of the driving thin film transistor, and a second electrode disposed at a layer different from a layer in which the first electrode is disposed and at least partially oversapping the first electrode; a first conductive layer disposed at a layer that is the same as the layer of the second electrode of the first capacitor; a second conductive layer disposed at a layer different from the layer in which the first conductive layer is disposed; and a bridge electrode disposed at a layer that is different from the first conductive layer and the second conductive layer, and contacting the first conductive layer and the second conductive layer such that the first conductive layer and the second conductive layer are electrically connected to each other.

The bridge electrode may be disposed under the first conductive layer.

The bridge electrode may be disposed at a layer that is the same as the layer in which the first electrode of the first capacitor is disposed.

The bridge electrode may include a material that is different from a material included in the first conductive layer.

The first conductive layer may include a plurality of metal layers.

The first conductive layer may include a first layer including aluminum, a second layer located over the first layer, and a third layer located under the first layer, and the second layer and the third layer comprise titanium.

The first capacitor may overlap with the driving thin film transistor.

The first electrode of the first capacitor may be the gate electrode of the driving thin film transistor.

The second conductive layer may be disposed at a layer that is the same as the active layer of the driving thin film transistor.

The thin film transistor array substrate may further include a power line electrically connected to the driving thin film transistor, wherein the second conductive layer may be disposed at a layer that is at the same layer level as the power line.

The power line may be disposed on the first capacitor.

The thin film transistor array substrate may further include a first insulating layer disposed between the first conductive layer and the bridge electrode, wherein a part of the first insulating layer may be disposed between the first electrode and the second electrode of the first capacitor.

The thin film transistor array substrate may further include a second insulating layer disposed on the first conductive layer, wherein an entire upper surface of the first conductive layer may be covered by the second insulating layer.

According to one or more exemplary embodiments of the present invention, a display apparatus includes: a substrate; a driving thin film transistor disposed on the substrate, the driving thin film transistor including an active layer, a gate electrode, a source electrode, and a drain electrode; a first capacitor including a first electrode connected to the gate electrode of the driving thin film transistor, and a second electrode disposed at a layer that is different from a layer at which the first electrode is disposed and at least partially oversapping the first electrode; a pixel electrode electrically connected to the driving thin film transistor and the first capacitor; a first conductive layer disposed at a layer that is the same as the layer at which the second electrode of the first capacitor is disposed; a second conductive layer disposed at a layer level that is different from the layer level of the first conductive layer; and a bridge electrode disposed at a layer level that is different from the levels of the layers at which the first conductive layer and the second conductive layer are disposed, and contacting the first conductive layer and the second conductive layer such that the first conductive layer and the second conductive layer are electrically connected to each other.

The bridge electrode may be disposed under the first conductive layer.

The bridge electrode may be disposed at a layer that is at the same layer level at which the first electrode of the first capacitor is disposed.

The bridge electrode may include a material that is different from a material included in the first conductive layer.

The first conductive layer may include a plurality of metal layers.

The display apparatus may further include a first insulating layer disposed between the first conductive layer and the bridge electrode, wherein a part of the first insulating layer may be disposed between the first electrode and the second electrode of the first capacitor.

The display apparatus may further include a second insulating layer disposed on the first conductive layer, wherein an entire upper surface of the first conductive layer may be covered by the second insulating layer.

BRIEF DESCRIPTION OF THE DRAWINGS

A more complete appreciation of the present invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
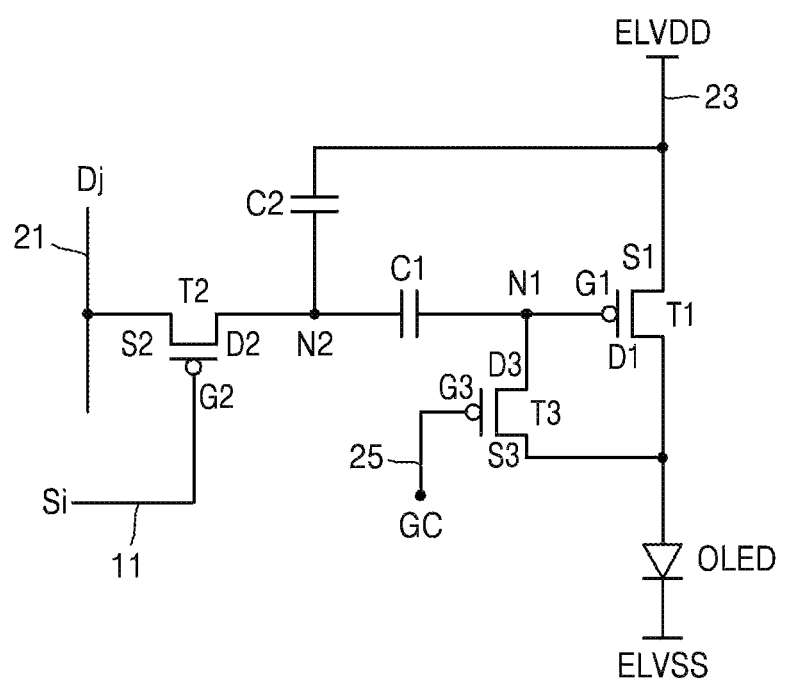
FIG. 1 is a circuit diagram of a pixel included in a display apparatus using a thin film transistor array substrate according to an exemplary embodiment of the present invention.

Since the present invention may have various modifications and several embodiments, exemplary embodiments are shown in the drawings and will be described in detail. Advantages, features, and a method of achieving the same will be specified with reference to the exemplary embodiments described below in detail together with the attached drawings. However, the exemplary embodiments may have different forms and should not be construed as being limited to the descriptions set forth herein.

Exemplary embodiments of the present invention will be described below in more detail with reference to the accompanying drawings. Those components that are the same or are in correspondence are assigned the same reference numeral in the drawings, and redundant explanations are omitted.

It will be understood that, although the terms "first," "second," etc. may be used herein to describe various components, these components should not be limited by these terms. These terms are only used to distinguish one component from another.

As used herein, the singular forms "a," "an" and "the" are intended to include the plural forms as well unless the context clearly indicates otherwise.

In the exemplary embodiments below, it will be further understood that the terms "comprise" and/or "have" used herein specify the presence of stated features or components, but do not preclude the presence or addition of one or more other features or components.

In the exemplary embodiments below, it will be understood that, when a portion such as a layer, an area, or an element is referred to as being "on" or "above" another portion, it can be directly on or above the other portion, or an intervening portion may also be present.

Also, in the drawings, for convenience of description, sizes of elements may be exaggerated or contracted. In other words, since sizes and thicknesses of components in the drawings are arbitrarily illustrated for convenience of explanation, the following embodiments are not limited thereto.

When an exemplary embodiment is implementable in another manner, a predetermined process order may be different from a described one. For example, two processes that are consecutively described may be substantially simultaneously performed or may be performed in an order opposite to the described order.

It will be understood that, when a portion such as a layer, an area, or an element is referred to as being connected, it can be connected directly, or an intervening portion may also be present. For example, it will be understood that, when a portion such as a layer, an area, or an element is referred to as being electrically connected, it can be electrically connected directly, or an intervening portion may also be present. As used herein, the term "and/or" includes any and all combinations of one or more of the associated listed items. Expressions such as "at least one of", when preceding a list of elements, modify the entire list of elements and do not modify the individual elements of the list.

FIG. 1 is a circuit diagram of a pixel included in a display apparatus using a thin film transistor array substrate according to an exemplary embodiment of the present invention. In the present specification, the thin film transistor array substrate may denote a substrate including at least one thin film transistor, and the display apparatus may denote a display panel such as an organic light-emitting diode (OLED) display apparatus or a liquid crystal display (LCD) apparatus including the thin film transistor array substrate. Hereinafter, a case where an OLED is formed on the thin film transistor array substrate will be described for convenience of description.

Referring to FIG. 1, the pixel includes an organic light-emitting diode OLED and a pixel circuit supplying an electric current to the organic light-emitting diode OLED. The pixel circuit may include first to third thin film transistors T1, T2, and T3, respectively, and first and second capacitors C1 and C2, respectively.

The first thin film transistor T1 includes a first gate electrode G1 connected to a first node N1, a first source electrode S1 connected to a power line 23 supplying a first power voltage ELVDD, and a first drain electrode D1 connected to a pixel electrode of the organic light-emitting diode OLED. The first thin film transistor T1 functions as a driving transistor, is turned on/turned off by a voltage at the first node N1, and controls a current supplied to the organic light-emitting diode OLED.

The second thin film transistor T2 may include a second gate electrode G2 connected to a scan line 11, a second source electrode S2 connected to a data line 21, and a second drain electrode D2 connected to a second node N2. The second thin film transistor T2 functions as a switching transistor, and is turned on by a scan signal S1 applied to the scan line 11 and transfers a data signal Dj inputted to the second source electrode S2 to the second node N2.

The third thin film transistor T3 may include a third gate electrode G3 connected to a compensation control line 25, a third drain electrode D3 connected to the first gate electrode G1 of the first thin film transistor T1 via the first node N1, and a third source electrode S3 connected to the pixel electrode of the organic light-emitting diode OLED and to the first drain electrode D1 of the first thin film transistor T1. When the third thin film transistor T3 is turned on by a compensation control signal GC applied to the third gate electrode G3 of the third thin film transistor T3, the first thin film transistor T1 may be diode-connected.

The first capacitor C1 is connected between the first node N1 and the second node N2, and the second capacitor C2 may be connected between the second node N2 and the power line 23 which applies the first power voltage ELVDD to the first source electrode S1 of the first thin film transistor T1.

The pixel electrode of the organic light-emitting diode OLED is connected to the pixel circuit, and a counter electrode is connected to a power source applying a second power voltage ELVSS. The organic light-emitting diode OLED generates light of a predetermined brightness in response to the current supplied from the pixel circuit.

Figure 2:
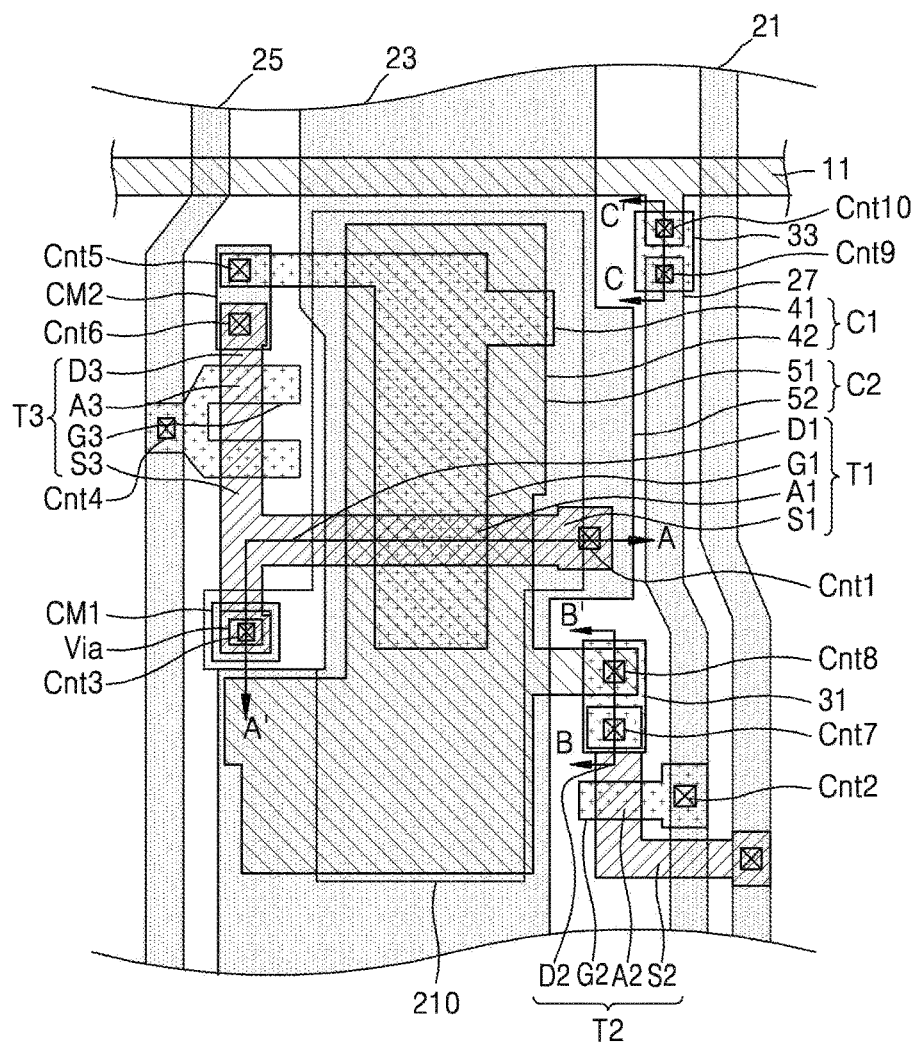
FIG. 2 is a plan view of a display apparatus using a thin film transistor array substrate according to an exemplary embodiment of the present invention.

FIG. 2 is a plan view of a display apparatus using a thin film transistor array substrate according to an exemplary embodiment of the present invention.

Referring to FIG. 2, the display apparatus includes the scan line 11 extending along a first direction, the data line 21, the power line 23, and the compensation control line 25 extending along a second direction crossing the first direction. In addition, the first to third thin film transistors T1, T2, and T3, respectively, and the first and second capacitors C1 and C2, respectively, may be located at regions where the scan line 11 and the data line 21 cross each other.

The first thin film transistor T1 includes a first active layer A1, the first gate electrode G1, the first source electrode S1, and the first drain electrode D1. The first source electrode S1 corresponds to a source region doped with impurities in the first active layer A1, and the first drain electrode D1 corresponds to a drain region doped with impurities in the first active layer A1. A region between the first source electrode S1 and the first drain electrode D1 in the first active layer A1 corresponds to a channel region. The first gate electrode G1 may be connected to the first electrode 41 of the first capacitor C1 and to the third drain electrode D3 of the third thin film transistor T3. The first source electrode S1 may be connected to the power line 23 via a first contact hole Cnt1.

The first thin film transistor T1 performs as a driving thin film transistor, and receives a data signal according to a switching operation of the second thin film transistor T2 so as to supply a driving current to the organic light-emitting diode OLED (see FIG. 1).

The second thin film transistor T2 includes a second active layer A2, the second gate electrode G2, the second source electrode S2, and the second drain electrode D2. The second source electrode S2 corresponds to a source region doped with impurities in the second active layer A2, and the second drain electrode D2 corresponds to a drain region doped with impurities in the second active layer A2. A region between the second source electrode S2 and the second drain electrode D2 in the second active layer A2 corresponds to the channel region. The second gate electrode G2 is turned on by a scan signal S1 applied to the scan line 11 so as to transfer a data signal Dj applied to the second source electrode S2 to the first thin film transistor T1. The second gate electrode G2 may be electrically connected to the scan line 11 via a connecting wire 27. The second gate electrode G2 may be connected to the connecting wire 27 via a second contact hole Cnt2, and the scan signal S1 may be applied from the scan line 11 to the second gate electrode G2 via the connecting wire 27.

The third thin film transistor T3 includes a third active layer A3, the third gate electrode G3, the third source electrode S3, and the third drain electrode D3. The third source electrode S3 corresponds to a source region doped with impurities in the third active layer A3, and the third drain electrode D3 corresponds to a drain electrode doped with impurities in the third active layer A3. A region between the third source electrode S3 and the third drain electrode D3 in the third active layer A3 corresponds to a channel region.

The third source electrode S3 of the third thin film transistor T3 is connected to the first drain electrode D1 of the first thin film transistor T1, and is connected to a pixel electrode 210 via a first cover metal CM1 and a via hole Via connected to a third contact hole Cnt3. If the third thin film transistor T3 is turned on by the compensation control signal GC (FIG. 1) that is applied to the third gate electrode G3 connected to the compensation control line 25, the first thin film transistor T1 is diode-connected. The third gate electrode G3 may be connected to the compensation control line 25 via a fourth contact hole Cnt4, and forms a dual-gate electrode so as to prevent a leakage current.

The first capacitor C1 may be connected to the first gate electrode G1 of the first thin film transistor T1. For example, the first electrode 41 of the first capacitor C1 may be connected to the first gate electrode G1 of the first thin film transistor T1, and may be connected to the third drain electrode D3 of the third thin film transistor T3 via a second cover metal CM2. The first gate electrode G1 of the first thin film transistor T1 may function as the first electrode 41 of the first capacitor C1. The second electrode 42 of the first capacitor C1 at least partially overlaps with the first electrode 41, and may be connected to the second drain electrode D2 of the second thin film transistor T2.

The second capacitor C2 may be disposed so as to overlap with the first capacitor C1. A first electrode 51 of the second capacitor C2 may be connected to the second electrode 42 of the first capacitor C1. For example, the second electrode 42 of the first capacitor C1 may function as the first electrode 51 of the second capacitor C2. A second electrode 52 of the second capacitor C2 is disposed so as to at least partially overlap with the first electrode 51, and may be connected to the power line 23. For example, a part of the power line 23 may form the second electrode 52 of the second capacitor C2.

The first to third active layers A1, A2, and A3, respectively, are formed at the same layer, and the first to third gate electrode G1, G2, and G3, respectively, are located on the first to third active layers A1, A2, and A3, respectively, and may be formed at the same layer. The second electrode 42 of the first capacitor C1, the first electrode 51 of the second capacitor C2, and the scan line 11 are located on the first to third gate electrodes G1, G2, and G3, respectively, and may be formed at the same layer. The data line 21, the power line 23, the compensation control line 25, and the connecting wire 27 are located over the second electrode 42 of the first capacitor C1 and the first electrode 51 of the second capacitor C2, and may be formed at the same layer.

The first gate electrode G1 of the first thin film transistor T1 and the third drain electrode D3 of the third thin film transistor T3, which are formed at different layers, may be electrically connected to each other via the second cover metal CM2 that contacts the first gate electrode G1 and the third drain electrode D3 via fifth and sixth contact holes Cnt5 and Cnt6, respectively. The second drain electrode D2 of the second thin film transistor T2 and the second electrode 42 of the first capacitor C1 (or the first electrode 51 of the second capacitor C2), which are formed at different layer levels from each other, may be electrically connected to each other via a first bridge electrode 31 that contacts the second drain electrode D2 and the second electrode 42 via seventh and eighth contact holes Cnt7 and Cnt8, respectively. The scan line 11 and the connecting wire 27 may be electrically connected to each other via a second bridge electrode 33 that contacts the scan line 11 and the connecting wire 27 via ninth and tenth contact holes Cnt9 and Cnt10, respectively.

Figure 3:
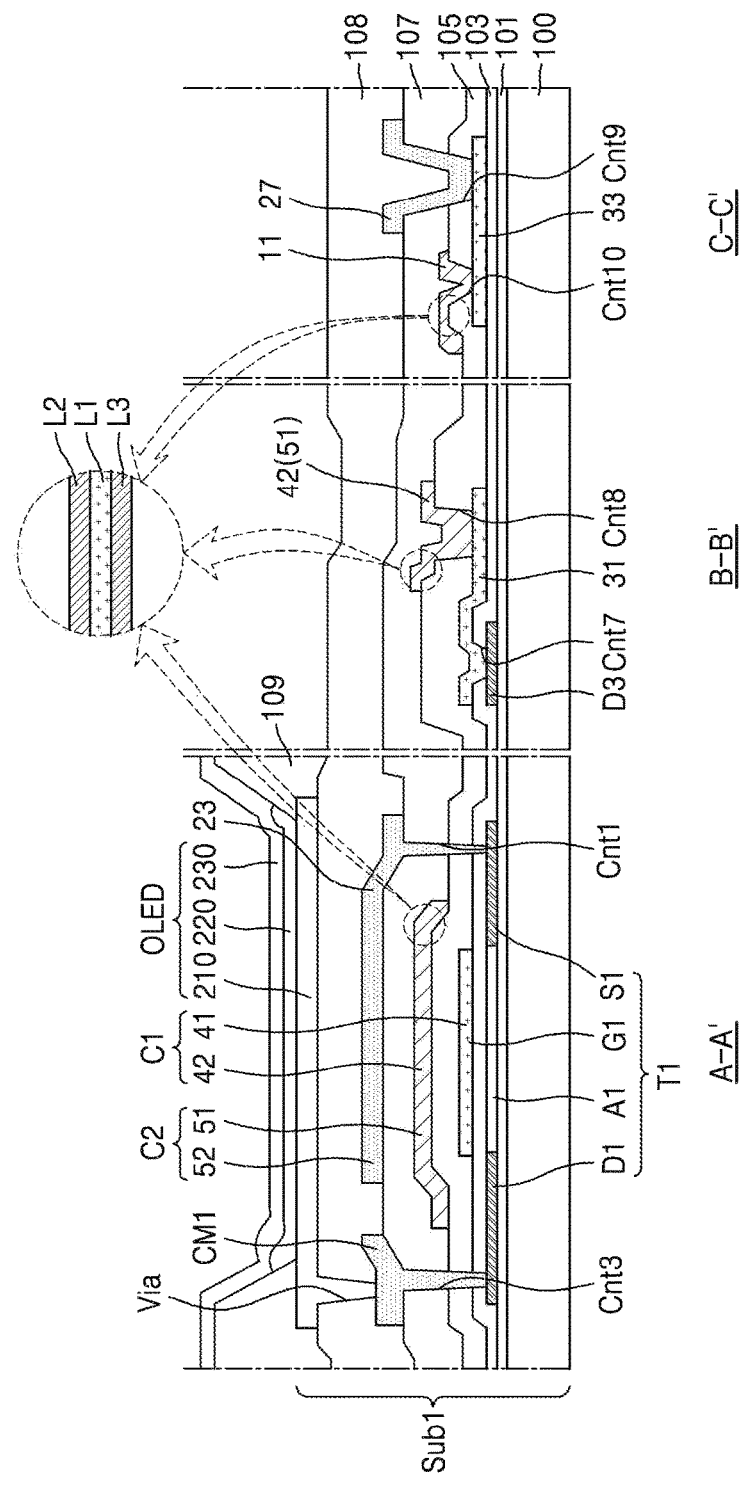
FIG. 3 is a cross-sectional view of the display apparatus taken along lines A-A', B-B', and C-C' of FIG. 2.

FIG. 3 is a cross-sectional view of the display apparatus taken along lines A-A', B-B', and C-C' of FIG. 2.

Referring to FIG. 3, a buffer layer 101 is formed on a substrate 100, and the first to third active layers A1, A2, and A3, respectively, are formed on the buffer layer 101. FIG. 3 shows the first thin film transistor T1 as a driving thin film transistor including the first active layer A1, the first drain electrode D1 and the first source electrode S1, and the third drain electrode D3 of the third thin film transistor T3.

A gate insulating layer 103 is formed on the first to third active layers A1 to A3, respectively. A metal pattern layer (hereinafter, referred to as a first metal pattern layer) including the first to third gate electrodes G1, G2, and G3, respectively, the first electrode 41 of the first capacitor C1, and the first and second bridge electrodes 31 and 33, respectively, are formed on the gate insulating layer 103.

A first insulating layer 105 is formed on the first metal pattern layer. A metal pattern layer (hereinafter, referred to as a second metal pattern layer), including the second electrode 42 of the first capacitor C1, the first electrode 51 of the second capacitor C2, and the scan line 11, is formed on the first insulating layer 105.

A second insulating layer 107 is formed on the second metal pattern layer. A metal pattern layer (hereinafter, referred to as a third metal pattern layer), including the first cover metal CM1, the second cover metal CM2, the second electrode 52 of the second capacitor C2, the data line 21, the power line 23, the compensation control line 25, and the connecting wire 27, is formed on the second insulating layer 107.

A third insulating layer 108 is formed on the third metal pattern layer, and the pixel electrode 210 is formed on the third insulating layer 108 to form a thin film transistor array substrate Sub1.

A pixel-defining layer 109 exposing an upper portion of the pixel electrode 210 is formed on the pixel electrode 210 of the thin film transistor array substrate Sub1. An intermediate layer 220, including an emission layer, is formed on the pixel electrode 210, and an opposite electrode 230 is formed on the intermediate layer 220. The organic light-emitting diode OLED, including the pixel electrode 210, the intermediate layer 220, and the opposite electrode 230, may emit light according to electric signals.

A part of the first insulating layer 105 is disposed between the first and second electrodes 41 and 42, respectively, of the first capacitor C1 to affect capacitance, and a part of the second insulating layer 107 is disposed between the first and second electrodes 51 and 52, respectively, of the second capacitor C2 to affect capacitance. The first to third insulating layers 105, 107 and 108, respectively, include an inorganic material and/or an organic material, and may be respectively formed to have a single-layered structure or a multi-layered structure.

The first metal pattern layer and the second metal pattern layer may have different materials. For example, the first metal pattern layer may include, for example, molybdenum (Mo), and the second metal pattern layer and/or the third metal pattern layer may be formed as a plurality of metal layers in order to reduce resistance. As an example, the second metal pattern layer and/or the third metal pattern layer may have a plurality of layers in which a first layer L1 including aluminum (Al) is formed, and a second layer L2 and a third layer L3 including titanium (Ti) are respectively formed over and under the first layer L1. In the present exemplary embodiment, the second metal pattern layer and/or the third metal pattern layer include Ti/Al/Ti, but are not limited thereto. According to another exemplary embodiment, the second metal pattern layer and the third metal pattern layer may be formed of different materials relative to each other.

The second electrode 42 of the first capacitor C1 and the scan line 11 (hereinafter, the second electrode 42 and the scan line 11 are referred to as a first conductive layer) located in the second metal pattern layer are not directly connected to the third drain electrode D3 and the connecting wire 27 (hereinafter, the third drain electrode D3 and the connecting wire 27 are referred to as a second conductive layer) formed at a different layer, but are connected to the second conductive layer via the first and second bridge electrodes 31 and 33, respectively, located under the first conductive layer. In the present specification, the conductive layer denotes a layer in which an electric current flows, that is, the conductive layer is an electrical conductive layer.

Since a bridge electrode (e.g., the first and/or second bridge electrodes 31 and 33, respectively) is located under the first conductive layer (e.g., the second electrode 42 of the first capacitor C1 and/or the scan line 11), the first conductive layer may be electrically connected to the second conductive layer (e.g., the third drain electrode D3 and/or the connecting wire 27) without forming a contact hole exposing the first conductive layer. In addition, since the contact hole exposing the first conductive layer is not formed, the second insulating layer 107 over the first conductive layer may cover an entire upper surface of the first conductive layer (e.g., entire upper surface of the second electrode of the first capacitor C1 and/or the scan line 11).

In one embodiment, the first bridge electrode 31 disposed under the second electrode 42 of the first capacitor C1 is connected to the third drain electrode D3 via the seventh contact hole Cnt7 exposing the third drain electrode D3, and is connected to the second electrode 42 of the first capacitor C1 via the eighth contact hole Cnt8 exposing the first bridge electrode 31. Thus, the second electrode 42 of the first capacitor C1 may be electrically connected to the third drain electrode D3 without exposing a part of the upper surface of the second electrode 42. In another embodiment, the second bridge electrode 33 disposed under the scan line 11 is respectively connected to the scan line 11 and the connecting wire 27 via the ninth and tenth contact holes Cnt9 and Cnt10, respectively. Thus, the scan line 11 may be electrically connected to the connecting wire 27 without exposing a part of the upper surface of the scan line 11.

Figure 4:
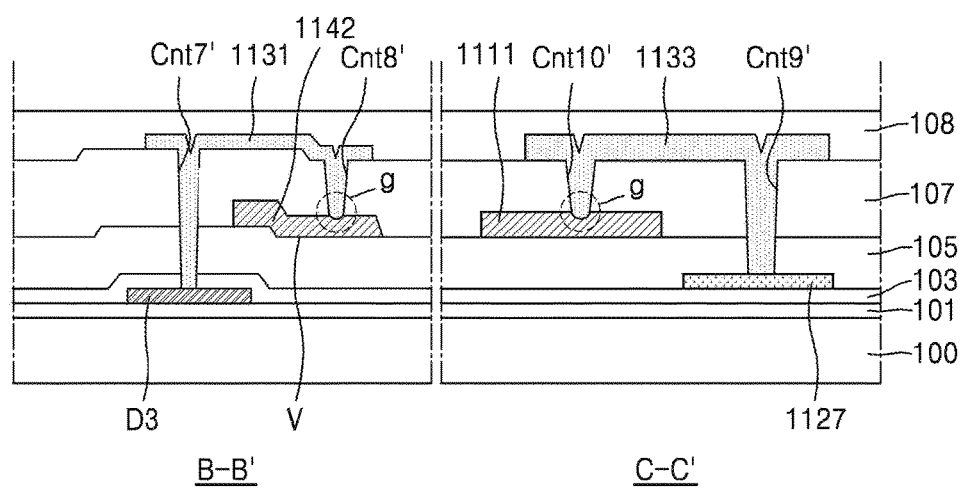
FIG. 4 is a cross-sectional view of a display apparatus according to a comparative example.
Figure 5:
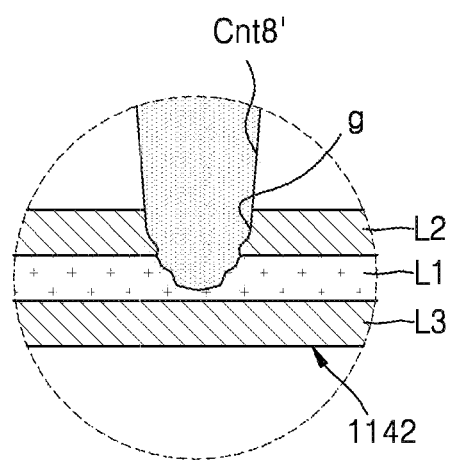
FIG. 5 is an enlarged view of a part V of FIG. 4.

FIG. 4 is a cross-sectional view of a display apparatus according to a comparative example, and FIG. 5 is an enlarged view of a part V in FIG. 4.

According to the cross-sectional view taken along line B-B of FIG. 4, a second electrode 1142 of the first capacitor C1 and the third drain electrode D3 are connected via a first bridge electrode 1131 located over the second electrode 1142 of the first capacitor C1 via seventh and eighth contact holes Cnt7' and Cnt8', respectively.

The seventh and eighth contact holes Cnt7' and Cnt8', respectively, are formed through a dry etching or a wet etching process, and a buffered oxide etch (BOE) solution may be used in an etching process and/or a post-process for forming the seventh and eighth contact holes Cnt7' and Cnt8', respectively. The second electrode 1142 of the first capacitor C1 may be formed of the first layer L1 including Al and the second and third layers L2 and L3 including Ti and located on and under the first layer L1, for reducing the resistance as described above (see FIG. 5).

Due to the BOE solution used in the process of forming the eight contact hole Cnt8' exposing the second electrode 1142 of the first capacitor C1, the second layer L2 (including T1) and the first layer L1 (including A1) of the second electrode 1142 may be damaged, and thus a groove g is formed in the second electrode 1142.

Likewise, according to the cross-sectional view taken along line C-C of FIG. 4, if a scan line 1111 formed of Ti/Al/Ti and a connecting wire 1127 are connected to each other via a second bridge electrode 1133 located over the scan line 1111, an upper portion of the scan line 1111 may be damaged during the process of forming a tenth contact hole Cnt10' and a groove g may be formed.

However, according to the exemplary embodiment of FIGS. 1-3, the first conductive layer (e.g., the second electrode 42 of the first capacitor C1 and the scan line 11) is connected to the second conductive layer (e.g., the third drain electrode D3 and the connecting wire 27) via the bridge electrode (e.g., the first and second bridge electrodes 31 and 33, respectively) under the first conductive layer, and thus damage to the first conductive layer may be prevented.

In addition, since the first and second bridge electrodes 31 and 33, respectively, include material different from that of the first conductive layer, for example, metal such as Mo that is hardly damaged by the BOE solution, damage to the first and second bridge electrodes 31 and 33, respectively, may be prevented during the process of forming the contact holes exposing the first and second bridge electrodes 31 and 33, respectively.

According to the one or more exemplary embodiments, the display apparatus is the organic light-emitting display apparatus because the organic light-emitting diode OLED is formed on the thin film transistor array substrate, but one or more exemplary embodiments are not limited thereto. According to another exemplary embodiment, the thin film transistor array substrate may be used to form a liquid crystal display apparatus.

As described above, according to the one or more of the above exemplary embodiments, circuit connection structures included in the thin film transistor array substrate and the display apparatus may not be damaged.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and detail may be made therein without departing from the spirit and scope as defined by the following claims.

What is claimed is:

1. A thin film transistor array substrate, comprising:
a substrate;
a driving thin film transistor disposed on the substrate, the driving thin film transistor including an active layer, a gate electrode, a source electrode, and a drain electrode;
a first capacitor including a first electrode connected to the gate electrode of the driving thin film transistor, and a second electrode at least partially overlapping the first electrode;
a first conductive layer disposed on a first layer that is the same layer on which the second electrode of the first capacitor is disposed;
a second conductive layer disposed under or over the first conductive layer;
a bridge electrode disposed on a second layer that is different from the layers on which the first conductive layer and the second conductive layer are disposed, and contacting the first conductive layer and the second conductive layer so that the first conductive layer and the second conductive layer are electrically connected to each other; and
a power line electrically connected to the driving thin film transistor;
wherein the second conductive layer is disposed on a layer that is the same layer as on which the power line is disposed.

2. The thin film transistor array substrate of claim 1, wherein the bridge electrode is disposed between the first conductive layer and the substrate.

3. The thin film transistor array substrate of claim 1, wherein the bridge electrode is disposed on the second layer that is the same layer on which the first electrode of the first capacitor is disposed.

4. The thin film transistor array substrate of claim 1, wherein the bridge electrode comprises a material that is different from a material included in the first conductive layer.

5. The thin film transistor array substrate of claim 1, wherein the first conductive layer comprises a plurality of metal layers.

6. The thin film transistor array substrate of claim 5, wherein the first conductive layer includes a first sub-conductive layer comprising aluminum, a second sub-conductive layer disposed over the first sub-conductive layer, and a third sub-conductive layer located under the first sub-conductive layer, the second sub-conductive layer and the third sub-conductive layer comprising titanium.

7. The thin film transistor array substrate of claim 1, wherein the first capacitor overlaps the driving thin film transistor.

8. The thin film transistor array substrate of claim 7, wherein the first electrode of the first capacitor is the gate electrode of the driving thin film transistor.

9. The thin film transistor array substrate of claim 1, wherein the power line is disposed over the first capacitor.

10. The thin film transistor array substrate of claim 1, further comprising a first insulating layer disposed between the first conductive layer and the bridge electrode;
wherein a part of the first insulating layer is disposed between the first electrode and the second electrode of the first capacitor.

11. The thin film transistor array substrate of claim 10, further comprising a second insulating layer disposed on the first conductive layer;
wherein an entire upper surface of the first conductive layer is covered by the second insulating layer.

12. A thin film transistor array substrate, comprising:
a substrate;
a driving thin film transistor disposed on the substrate, the driving thin film transistor including an active layer, a gate electrode, a source electrode, and a drain electrode;
a first capacitor including a first electrode connected to the gate electrode of the driving thin film transistor, and a second electrode at least partially overlapping the first electrode;
a first conductive layer disposed on a first layer that is the same layer on which the second electrode of the first capacitor is disposed;
a second conductive layer disposed under or over the first conductive layer; and
a bridge electrode disposed on a second layer that is different from the layers on which the first conductive layer and the second conductive layer are disposed, and contacting the first conductive layer and the second conductive layer so that the first conductive layer and the second conductive layer are electrically connected to each other, wherein the second conductive layer is disposed on a third layer that is the same layer on which the active layer of the driving thin film transistor is disposed.

13. A display apparatus, comprising:
a substrate;
a driving thin film transistor disposed on the substrate, the driving thin film transistor including an active layer, a gate electrode, a source electrode, and a drain electrode;
a first capacitor including a first electrode connected to the gate electrode of the driving thin film transistor, and a second electrode at least partially overlapping the first electrode;
a pixel electrode electrically connected to the driving thin film transistor and disposed over the first capacitor;
a first conductive layer disposed on a first layer that is the same layer on which the second electrode of the first capacitor is disposed;
a second conductive layer under or over the first conductive layer; and
a bridge electrode disposed on a second layer level that is different from the layers on which the first conductive layer and the second conductive layer are disposed, and contacting the first conductive layer and the second conductive layer so that the first conductive layer and the second conductive layer are electrically connected to each other.

14. The display apparatus of claim 13, wherein the bridge electrode is disposed between the first conductive layer and the substrate.

15. The display apparatus of claim 13, wherein the bridge electrode is disposed on the second layer that is the same layer on which the first electrode of the first capacitor is disposed.

16. The display apparatus of claim 13, wherein the bridge electrode Comprises a material that is different from a material included in the first conductive layer.

17. The display apparatus of claim 13, wherein the first conductive layer comprises a plurality of metal layers.

18. The display apparatus of claim 13, further comprising a first insulating layer disposed between the first conductive layer and the bridge electrode;
wherein a part of the first insulating layer is disposed between the first electrode and the second electrode of the first capacitor.

19. The display apparatus of claim 13, further comprising a second insulating layer disposed on the first conductive layer,
wherein an entire upper surface of the first conductive layer is covered by the second insulating layer.

* * * * *